United States Patent
Chae

(10) Patent No.: US 7,061,020 B2
(45) Date of Patent: Jun. 13, 2006

(54) ARRAY SUBSTRATE FOR A LIQUID CRYSTAL DISPLAY DEVICE HAVING AN IMPROVED CONTACT PROPERTY AND FABRICATING METHOD THEREOF

(75) Inventor: Gee Sung Chae, Incheon-kwangyokshi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 81 days.

(21) Appl. No.: 10/942,951

(22) Filed: Sep. 17, 2004

(65) Prior Publication Data

US 2005/0041170 A1    Feb. 24, 2005

Related U.S. Application Data

(62) Division of application No. 10/319,708, filed on Dec. 16, 2002, now Pat. No. 6,861,368.

(30) Foreign Application Priority Data

Dec. 27, 2001    (KR)    ...................... 10-2001-0086429

(51) Int. Cl.
*H01L 31/336*    (2006.01)
*H01L 29/15*     (2006.01)
*H01L 21/302*    (2006.01)

(52) U.S. Cl. ........................... 257/72; 257/22; 438/738; 438/652

(58) Field of Classification Search .................. 257/72, 257/22; 438/738, 652
See application file for complete search history.

(56) References Cited

U.S. PATENT DOCUMENTS 6,121,156 A * 9/2000 Shamble et al. ............ 438/734
6,529,251 B1 * 3/2003 Hibino et al. ................ 349/42

* cited by examiner

*Primary Examiner*—Long Pham
*Assistant Examiner*—Shrinivas H. Rao
(74) *Attorney, Agent, or Firm*—McKenna Long & Aldridge LLP

(57) ABSTRACT

An array substrate for a liquid crystal display device includes: a substrate; a gate electrode on the substrate; a gate insulating layer on the gate electrode; a semiconductor layer on the gate insulating layer; source and drain electrodes on the semiconductor layer, the source and drain electrodes including a copper layer as an upper layer and a barrier layer as a lower layer; a first passivation layer on the source and drain electrodes; a second passivation layer on the first passivation layer, the second passivation layer having a drain contact hole through the first passivation layer, the drain contact hole exposing the barrier layer; and a pixel electrode connected to the barrier layer through the drain contact hole.

12 Claims, 8 Drawing Sheets

ARRAY SUBSTRATE FOR A LIQUID CRYSTAL DISPLAY DEVICE HAVING AN IMPROVED CONTACT PROPERTY AND FABRICATING METHOD THEREOF

CROSS-REFERENCE TO RELATED APPLICATIONS

This application is a divisional application of U.S. patent application Ser. No. 10/319,708 filed Dec. 16, 2002, now U.S. Pat. No. 6,861,368, which claims priority to Korean Patent Application No. 2001-86429 filed Dec. 27, 2001, each of which are incorporated by reference for all purposes as if fully set forth herein.

BACKGROUND OF THE INVENTION

1. Field of the Invention

The present invention relates to a liquid crystal display (LCD) device, and more particularly to an array substrate for an LCD device having an improved contact property.

2. Discussion of the Related Art

LCD devices are developed as next generation display devices because of their lightweight, thin profile, and low power consumption characteristics. In general, an LCD device is a non-emissive display device that displays images using a refractive index difference having optical anisotropy properties of liquid crystal material that is interposed between a thin film transistor (TFT) array substrate and a color filter (C/F) substrate. Presently, among the various type of LCD devices commonly used, active matrix LCD (AM-LCD) devices have been developed because of their high resolution and superiority in displaying moving images. The AM-LCD device includes a TFT per each pixel region as a switching device, a first electrode for ON/OFF, and a second electrode used for a common electrode.

LCD devices can obtain a higher reliability and a stronger competitive power in price by selecting a metal of low resistivity and a strong corrosion resistance as a material for a metal line delivering a signal. Aluminum (Al) or Al alloy is widely used as the material for the metal line. However, as LCD devices become larger and a resolution of LCD devices becomes higher such as SVGA (Super Video Graphics Adapter), XGA (Extended Graphics Adapter), SXGA (Super Extended Graphics Adapter) and UXGA (Ultra Extended Graphics Adapter), a scanning time becomes shorter and a signal-treating speed becomes higher. To satisfy these needs, a metallic material of low resistance is selected as the material for the metal line. Accordingly, copper (Cu), which has a lower resistivity and a higher resistance to electromigration property than a conventional material is suggested for the metal line. However, since Cu has a poor adhesion to a glass substrate and a high diffusivity into a silicon material (e.g., insulating layer or semiconductor layer) under a relatively low temperature (about 200° C.), Cu cannot be used as the single material for the metal line.

To solve these problems, when a Cu line is selected as gate and data lines for an LCD device, a structure is suggested where an additional barrier layer is interposed between the glass substrate and the gate line, and between the semiconductor layer and the data line. The barrier layer improves an adhesion of the Cu line to the glass substrate and prevents a diffusion of Cu into the semiconductor layer. LCD devices having an improved aperture ratio and an improved display quality are briskly researched and developed by applying a Cu line including a barrier layer to an LCD device having an organic insulating layer of a low dielectric constant. For example, titanium (Ti) is used as a metallic material for the barrier layer.

In FIG. 1, a gate line 62 and a data line 74 cross each other and a thin film transistor (TFT) "T" is disposed at a crossing of the gate and data lines 62 and 74. A pixel region is defined by the gate and data lines 62 and 74 and a pixel electrode 88 at the pixel region is connected to the TFT "T." Here, the pixel electrode 88 partially overlaps the gate and data lines 62 and 74. A passivation layer (not shown) of a low dielectric constant is interposed between the pixel electrode 88 and the data line 74 to prevent an electric interference therebetween. A gate pad 64 and a data pad 73 are disposed at one end of the gate line 62 and the data line 73, respectively. A gate pad terminal 90 and a data pad terminal 92 of the same material as the pixel electrode 88 are formed on the gate pad 64 and a data pad 73, respectively. Indium-tin-oxide (ITO) or indium-zinc-oxide (IZO) is mainly used as the material for the pixel electrode 88, the gate and data pad terminals 90 and 92. The gate and data lines 62 and 74 have a double-layered structure of an upper intrinsic copper layer and a lower barrier layer such as Cu/Ti. Each copper layer including the barrier layer of the TFT "T" and the gate and data pads 64 and 73 is connected to respective ITO electrode of the pixel electrode 88, the gate and data pad terminals 90 and 92 through respective a drain contact hole 80, and gate and data pad contact holes 82 and 84.

FIGS. 2A to 2D are schematic cross-sectional views, which are taken along a line II—II of FIG. 1, showing a fabricating process of an array substrate for an LCD device of a high aperture ratio using a Cu line including a barrier layer of the related art.

In FIG. 2A, first and second passivation layers 52 and 54 are formed over a TFT "T" and a gate pad 64. Here, a gate insulating layer 50, the first and second passivation layers 52 and 54 are sequentially formed on the gate pad 64. The TFT "T" includes a gate electrode 60, a semiconductor layer 70, source and drain electrodes 76 and 78. The gate insulating layer 50 and the first passivation layer 52 are made of silicon nitride (SiNx), and the second passivation layer 54 is made of an organic insulating material having a low dielectric constant. Generally, the gate insulating layer 50 and the first passivation layer 52 are formed by using a deposition apparatus such as a chemical vapor deposition (CVD) apparatus, and the second passivation layer 54 is formed by using a coating apparatus such as a spinner.

FIG. 2B, first and second open holes 80a and 82b respectively corresponding to the gate pad 64 and the drain electrode 78 are formed in the second passivation layer 54. For example, when the second passivation layer 54 is made of a photosensitive organic insulating material, the first and second open holes 80a and 82b are formed through a photolithography process including an exposure, a development and a curing.

In FIG. 2C, a gate pad contact hole 80 exposing the gate pad 64 and a drain contact hole 82 exposing the drain electrode 78 are formed through dry-etching a insulating material corresponding to the first and second open holes 80a and 82b (of FIG. 2B). In detail, the gate pad contact hole 80 is formed through the first and second passivation layers 52 and 54, and a gate insulating layer 50, and the drain contact hole 82 is formed through the first and second passivation layers 52 and 54. Here, after a substrate having the first and second open holes 80a and 82b is loaded in a vacuum chamber and a reaction gas such as $SH_6$ and $CH_4$ (methane) is injected into the vacuum chamber, plasma is generated in the vacuum chamber under a specific pressure. Thus, the insulating material corresponding to the first and second open holes 80*a* and 82*b* (of FIG. 2B) is etched through a bombardment or a chemical reaction between the ionized reaction gas and a thin film of the insulating material.

In FIG. 2D, a gate pad terminal 90 and a pixel electrode 88 of a transparent conductive material are formed on the second passivation layer 54. The gate pad terminal 90 is connected to the gate pad 64 through the gate pad contact hole 80, and the pixel electrode 88 is connected to the drain electrode 78 through the drain contact hole 82.

FIG. 3 is a schematic cross-sectional view showing an inferior contact hole of an array substrate for an LCD device of a high aperture ratio using a Cu line including a barrier layer of the related art.

In FIG. 3, a metal line 10 includes a first metal layer 10*a* as a barrier layer and a second metal layer 10*b* of a Cu layer on the first layer 10*a*. A first passivation layer 12 of silicon insulating material and a second passivation layer 14 of an organic insulating material are sequentially formed on the metal line 10. The first and second passivation layers 12 and 14 have a contact hole 16 exposing the metal line 10. During a dry-etching process for the contact hole 16 in the first and second passivation layers 12 and 14, an organic material of the second passivation layer 14 loses its moisture due to a reaction with plasma to be an organic residue 15 on the second metal layer 10*b*. The organic residue 15 is seldom eliminated through a following cleaning process and causes a inferior contact property between an ITO layer and the Cu layer during a forming process of pad terminals and a pixel electrode of ITO. As a result, the organic residue 15 interferes an electric connection between the ITO layer and the Cu layer to cause an inferiority of electric signal input.

SUMMARY OF THE INVENTION

Accordingly, the present invention is directed to a liquid crystal display device that substantially obviates one or more of problems due to limitations and disadvantages of the related art.

An advantage of the present invention is to provide an array substrate for a liquid crystal display device having an improved contact property and fabricating method thereof.

An advantage of the present invention is to improve electric characteristics of a liquid crystal display device.

An advantage of the present invention is to provide an array substrate for a liquid crystal display device of a high aperture ratio using a copper line including a barrier layer where an inferior contact property due to an organic residue during a contact hole process is improved and electric characteristics increase through an effective combination of an organic insulating layer for high aperture ratio and a copper layer of low resistance.

Another advantage of the present invention is to provide an array substrate for a liquid crystal display device of a high aperture ratio using a copper line including a barrier layer where an upper copper layer is eliminated during a contact hole process and a lower barrier layer is electrically connected to an ITO layer.

Additional features and advantages of the invention will be set forth in the description that follows, and in part will be apparent from the description, or may be learned by practice of the invention. Other advantages of the invention will be realized and attained by the structure particularly pointed out in the written description and claims hereof as well as the appended drawings.

To achieve these and other advantages and in accordance with the purpose of the present invention, as embodied and broadly described, an array substrate for a liquid crystal display device includes: a substrate; a gate electrode on the substrate; a gate insulating layer on the gate electrode; a semiconductor layer on the gate insulating layer; source and drain electrodes on the semiconductor layer, the source and drain electrodes including a copper layer as an upper layer and a barrier layer as a lower layer; a first passivation layer on the source and drain electrodes; a second passivation layer on the first passivation layer, the second passivation layer having a drain contact hole through the first passivation layer, the drain contact hole exposing the barrier layer; and a pixel electrode connected to the barrier layer through the drain contact hole.

In another aspect of the present invention, a fabricating method of an array substrate for a liquid crystal display device includes: forming a gate electrode on a substrate; depositing a gate insulating layer on the gate electrode; forming a semiconductor layer on the gate insulating layer; forming source and drain electrodes on the semiconductor layer, the soured and drain electrodes including a copper layer as an upper layer and a barrier layer as a lower layer; depositing a first passivation layer on the source and drain electrodes; depositing a second passivation layer on the first passivation layer; etching the first and second passivation layers to form a drain contact hole exposing the drain electrode; etching the copper layer of the drain electrode corresponding to the drain contact hole to expose the barrier layer; and forming a pixel electrode connected to the barrier layer through the drain contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included herewith to provide a further understanding of the invention and are incorporated in and constitute a part of this specification, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, similar reference numbers will be used throughout the drawings to refer to the same or like parts.

Figure 1:
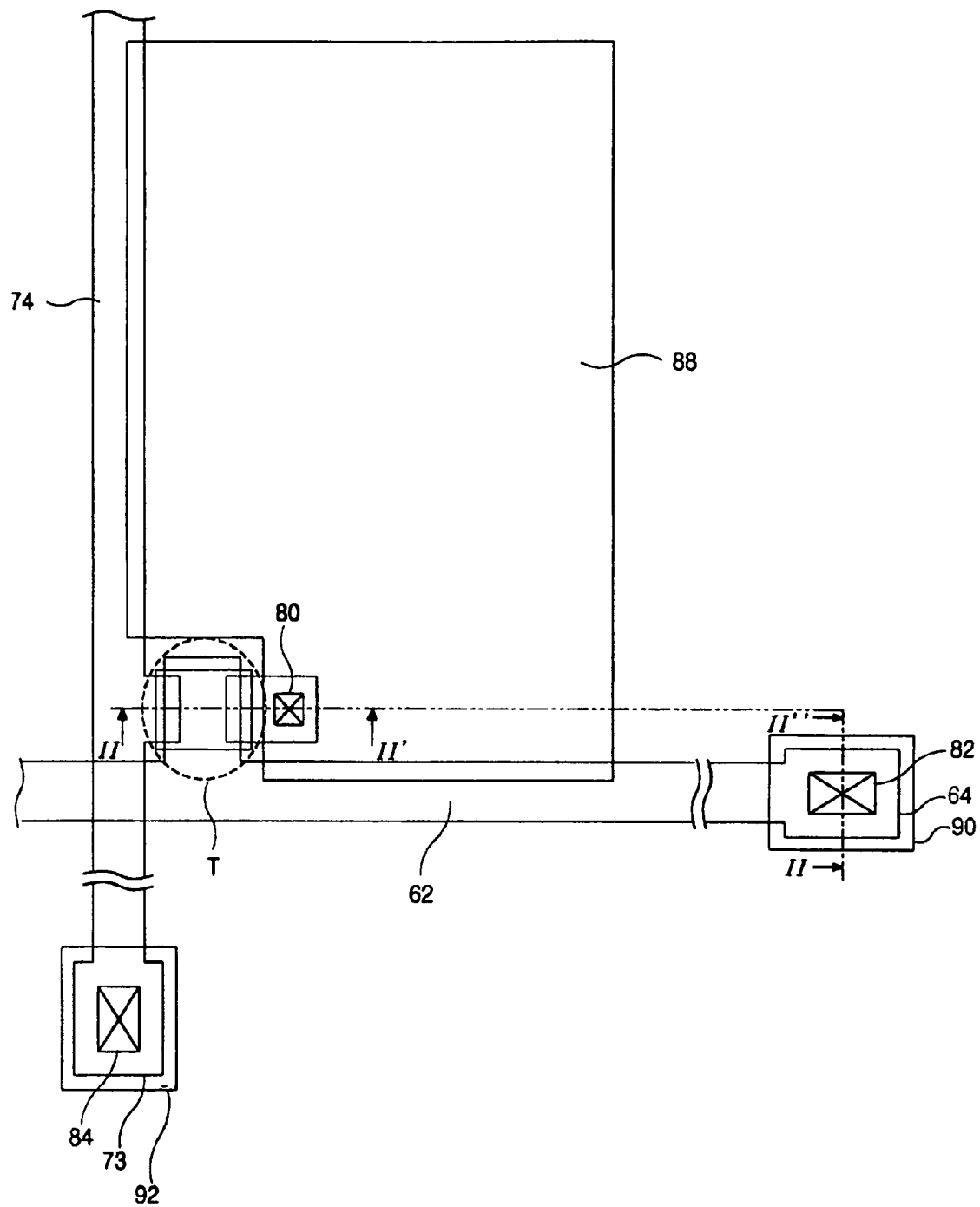
FIG. 1 is a schematic plan view showing an array substrate for an LCD device of a high aperture ratio using a copper line including a barrier layer of the related art.
Figure 2A:
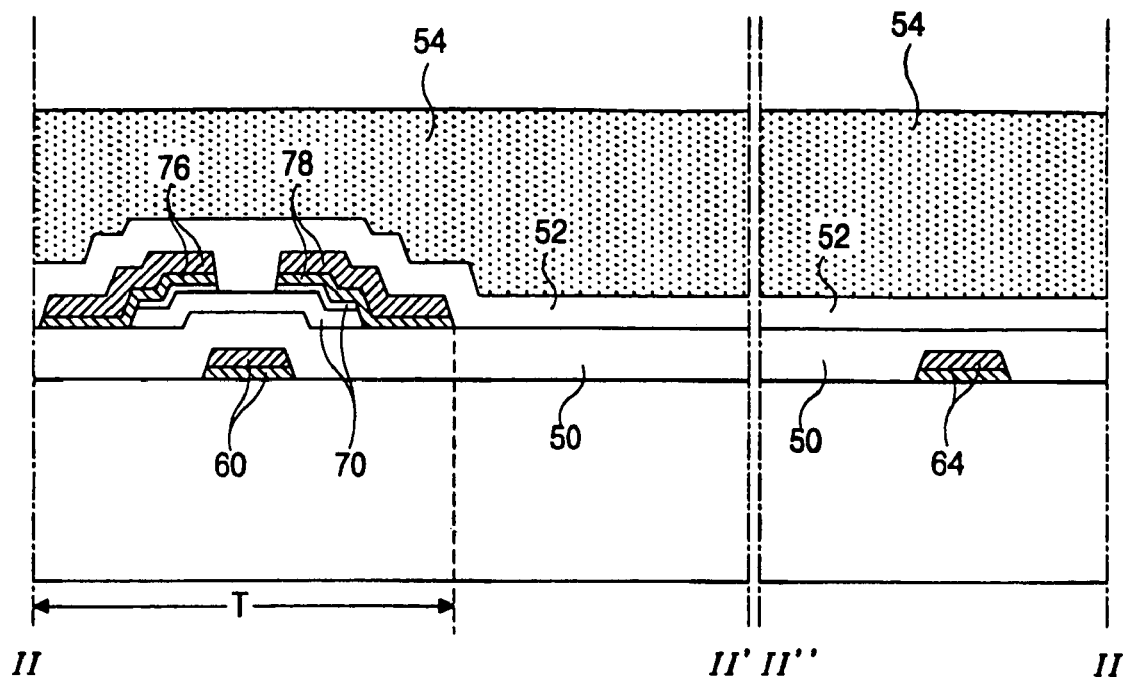
FIGS. 2A to 2D are schematic cross-sectional views, which are taken along a line II—II of FIG. 1, showing a fabricating process of an array substrate for an LCD device of a high aperture ratio using a Cu line including a barrier layer of the related art.
Figure 2B:
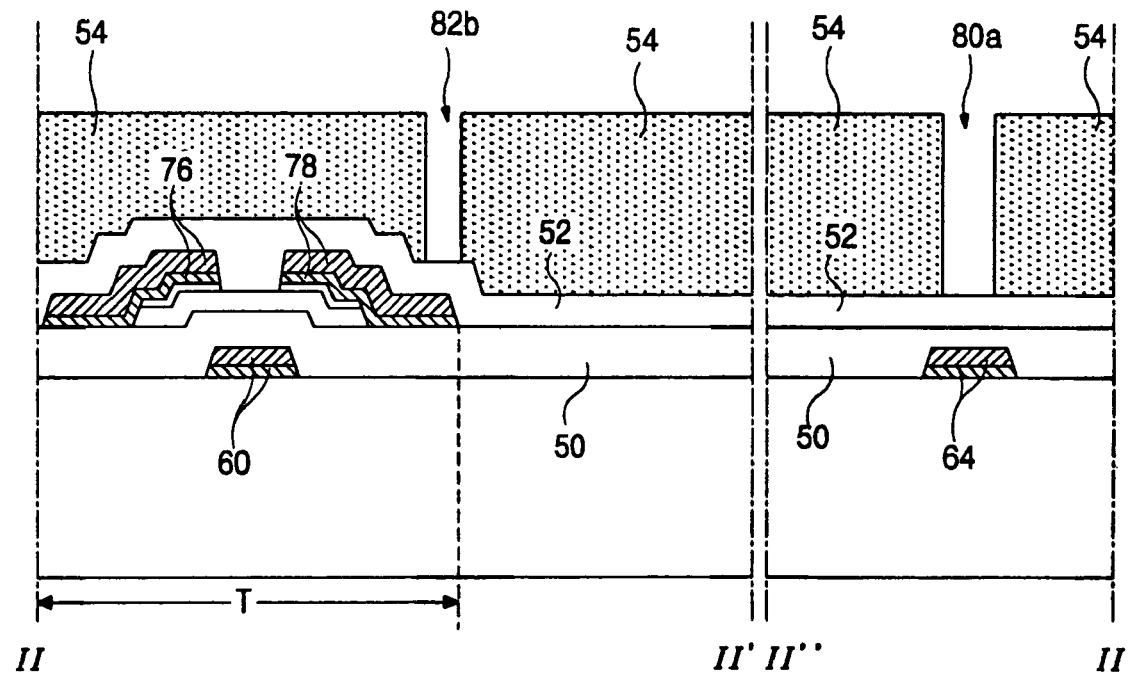
Figure 2C:
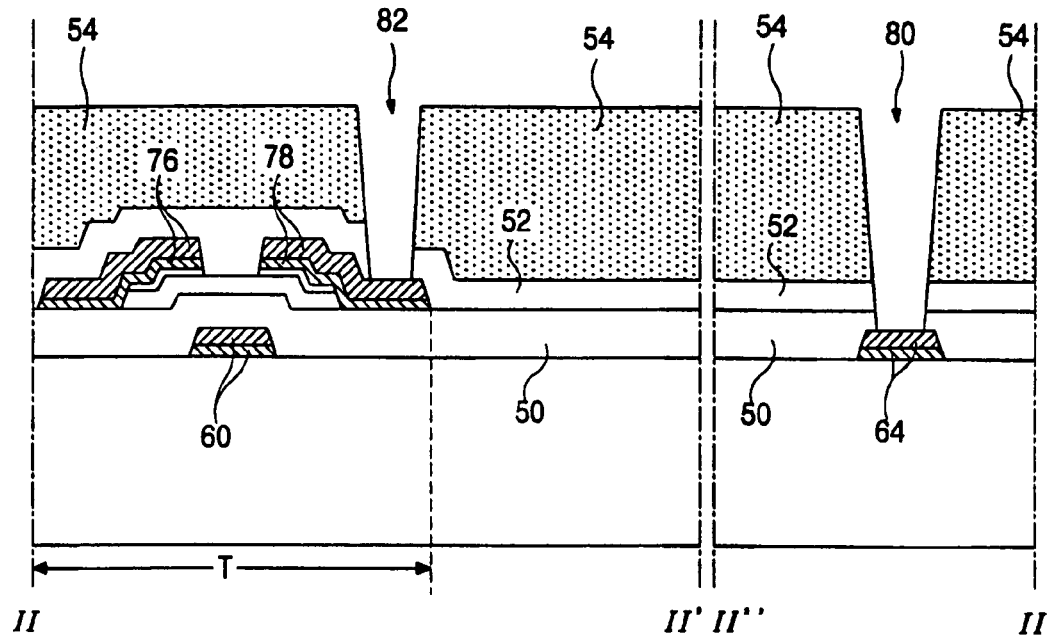
Figure 2D:
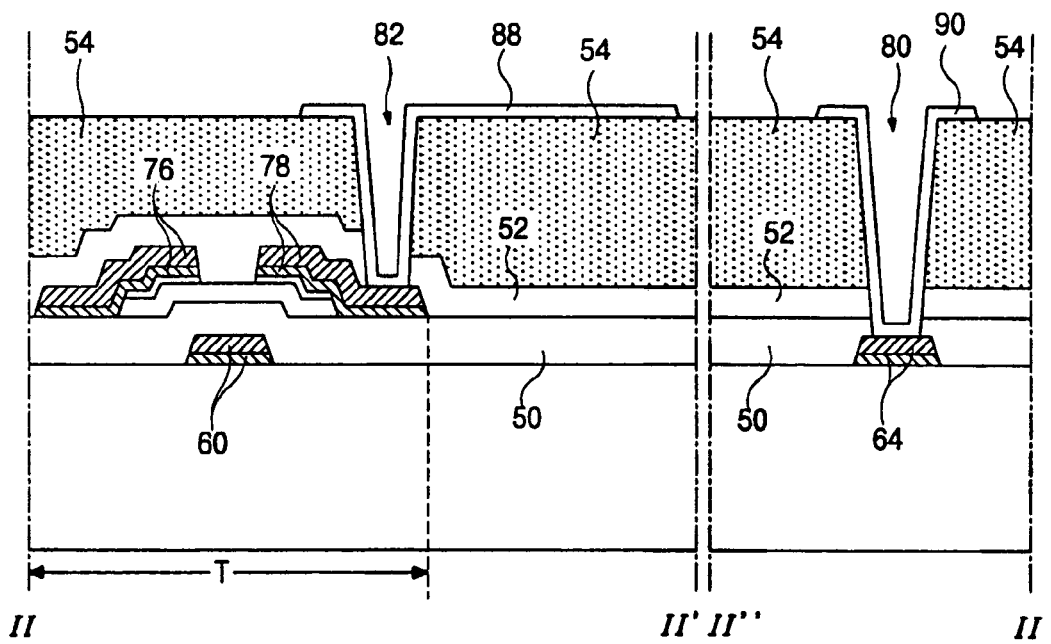
Figure 3:
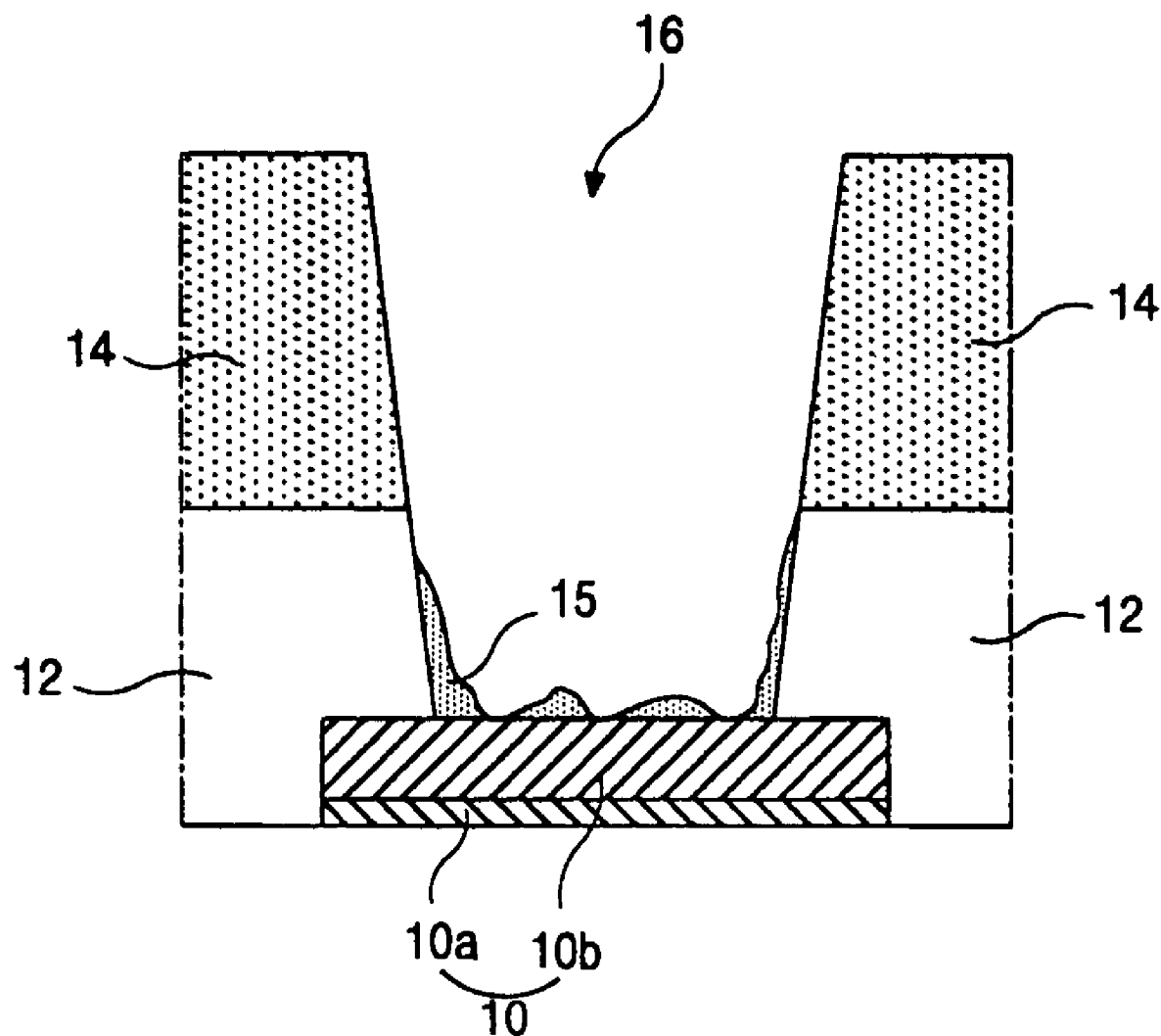
FIG. 3 is a schematic cross-sectional view showing an inferior contact hole of an array substrate for an LCD device of a high aperture ratio using a Cu line including a barrier layer of the related art.
Figure 4:
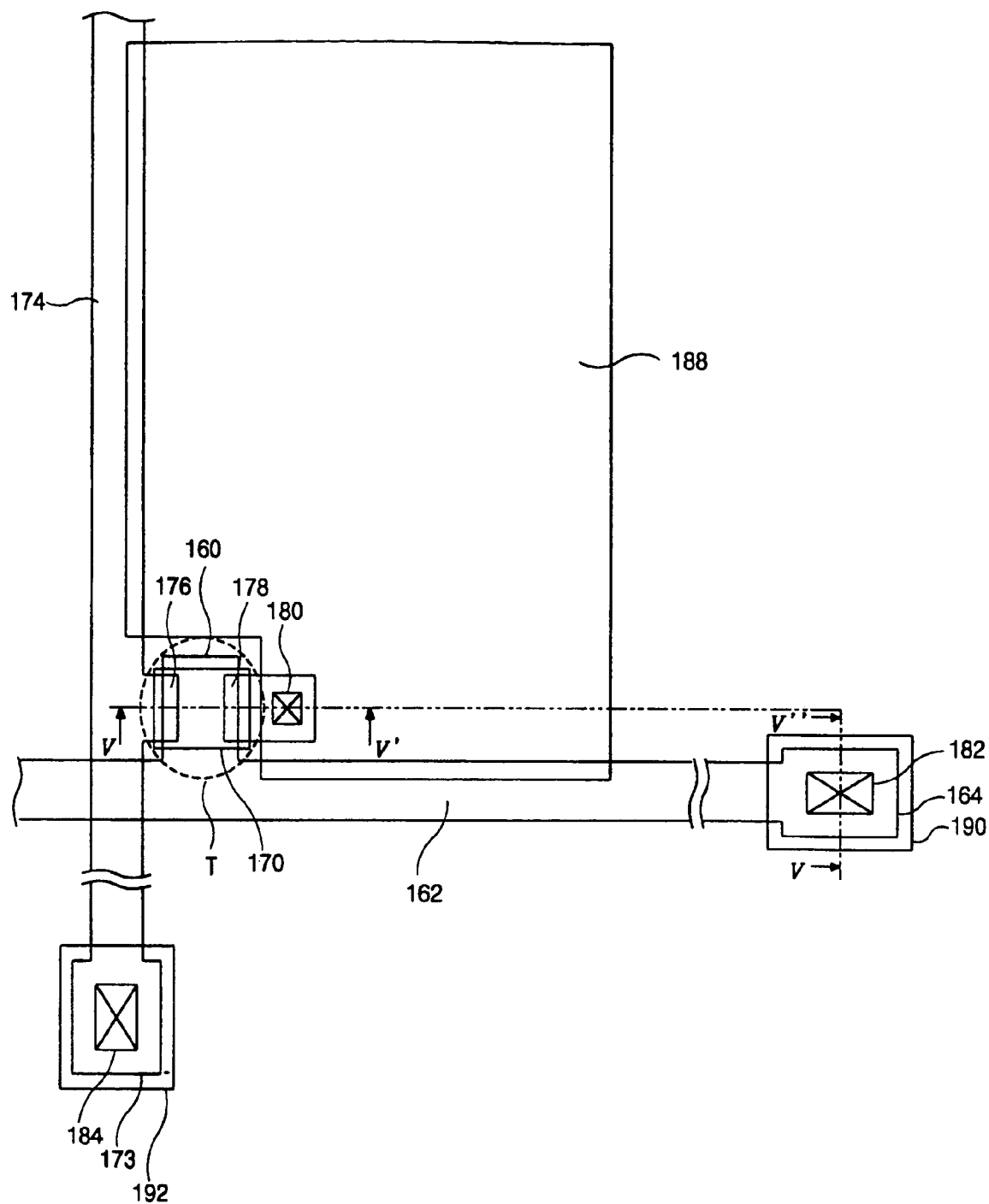
FIG. 4 is a schematic plan view of an array substrate for a liquid crystal display device according to an exemplary embodiment of the present invention.

FIG. 4 is a schematic plan view of an array substrate for a liquid crystal display device according to an exemplary embodiment of the present invention.

In FIG. 4, a gate line 162 and a data line 174 crossing each other are formed on a substrate (not shown). A thin film transistor "T" including a gate electrode 160, an active layer 170, and source and drain electrodes 176 and 178 is formed at a crossing point of the gate and data lines 162 and 174. A gate pad 164 and a data pad 173 are formed at ends of the gate and data lines 162 and 174, respectively. The gate and data lines 162 and 174 have a double-layered structure of a copper layer as an upper layer and a barrier layer as a lower layer. The barrier layer includes a material having a good adhesion to a glass substrate and a good chemical resistance, for example, a titanium (Ti), molybdenum (Mo), chromium (Cr) or indium (In). An insulating layer (not shown) covering the drain electrode 178, the gate pad 164 and the data pad 173 has a drain contact hole 180, a gate pad contact hole 182 and a data pad contact hole 184. The drain contact hole 180, the gate pad contact hole 182 and the data pad contact hole 184 expose the barrier layers of the drain electrode 178, the gate pad 164 and the data pad 173, respectively. Accordingly, a pixel electrode 188, a gate pad terminal 190 and a data pad terminal 192 are connected to the barrier layers of the drain electrode 178, the gate pad 164 and the data pad 173 through the drain contact hole 180, the gate pad contact hole 182 and the data pad contact hole 184, respectively. The insulating layer between the data line 174 and the pixel electrode 188 has a low dielectric constant to prevent an electric interference between metallic materials.

In the above structure, an organic residue resulting from a contact hole forming process of an LCD device that uses a copper line including a related art barrier layer is eliminated through an etching process of a copper layer. Moreover, since an indium-tin-oxide (ITO) electrode of a pixel electrode, a gate pad terminal and a data pad terminal is connected to a barrier layer and a side of a copper layer of a drain electrode, a gate pad and a data pad, a poor electric connection is prevented.

FIGS. 5A to 5E are schematic cross-sectional views illustrating a fabricating process of an array substrate for an LCD device according to an exemplary embodiment of the present invention. For the purposes of explanation, FIGS. 5A to 5E are taken along the line V—V of FIG. 4.

Figure 5A:
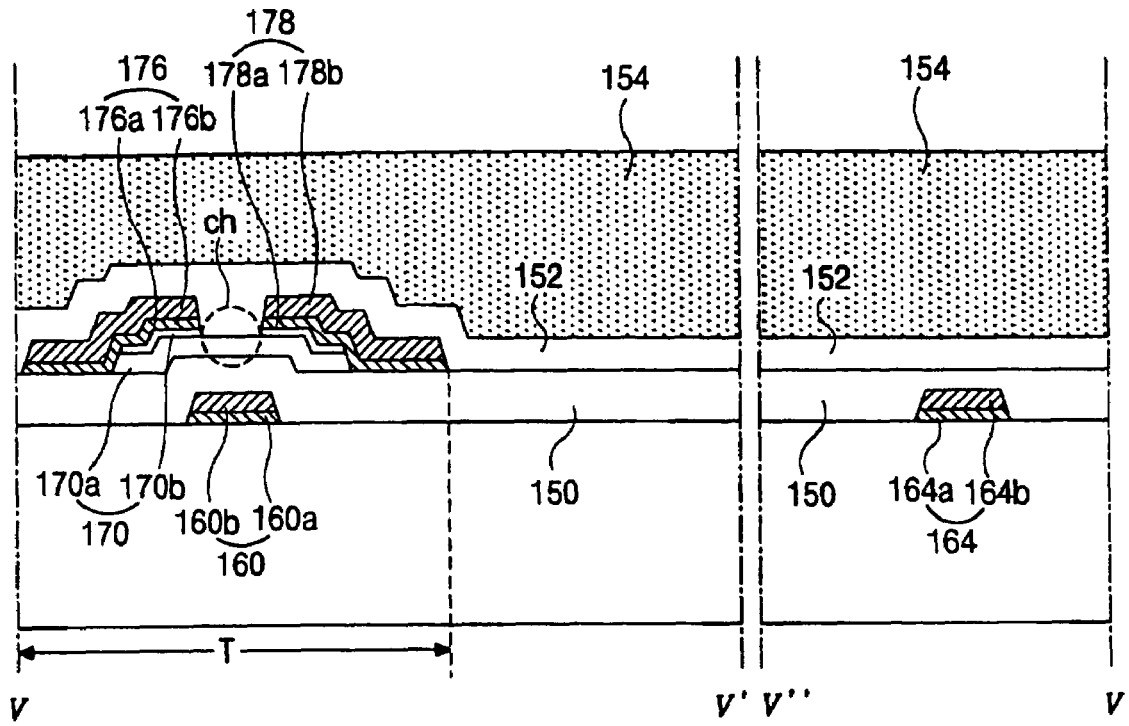
FIGS. 5A to 5E are schematic cross-sectional views illustrating a fabricating process of an array substrate for an LCD device according to an exemplary embodiment of the present invention.

In FIG. 5A, a gate electrode 160 and a gate pad 164 are formed on a substrate 100. Next, a gate insulating layer 150 is formed on the gate electrode 160 and the gate pad 164. A semiconductor layer 170 including an active layer 170a and an ohmic contact layer 170b is formed on the gate insulating layer 150 over the gate electrode 160. After source and drain electrodes 176 and 178 spaced apart from each other are formed on the semiconductor layer 170, a channel "ch" of the active layer 170b is formed through etching the ohmic contact layer 170b between the source and drain electrodes 176 and 178. Thus, a thin film transistor (TFT) "T" including the gate electrode 160, the semiconductor layer 170, and the source and drain electrodes 176 and 178 is completed. Next, first and second passivation layers 152 and 154 are sequentially formed on the gate pad 164 and the TFT "T." Here, the gate pad 164, the gate electrode 160, and the source and drain electrodes 176 and 178 have a double-layered structure of a copper layer as an upper layer and a barrier layer as a lower layer. Each barrier layer 164a, 160a, and 176a and 178a of the gate pad 164, the gate electrode 160, and the source and drain electrodes 176 and 178 includes a metallic material such as titanium (Ti) and molybdenum (Mo), while each copper layer 164b, 160b, 176b and 178b of the gate pad 164, the gate electrode 160, and the source and drain electrodes 176 and 178 includes intrinsic copper. The gate insulating layer 150 and the first passivation layer 152 include an inorganic insulating material such as a silicon insulating material, preferably, a silicon nitride (SiNx). The second passivation layer 154 includes one of organic and inorganic insulating materials such as silicon nitride (SiNx) and silicon oxide ($SiO_2$). Preferably, the second passivation layer 154 includes an organic insulating material of low dielectric constant less than about 3 ($\in$<3).

Figure 5B:
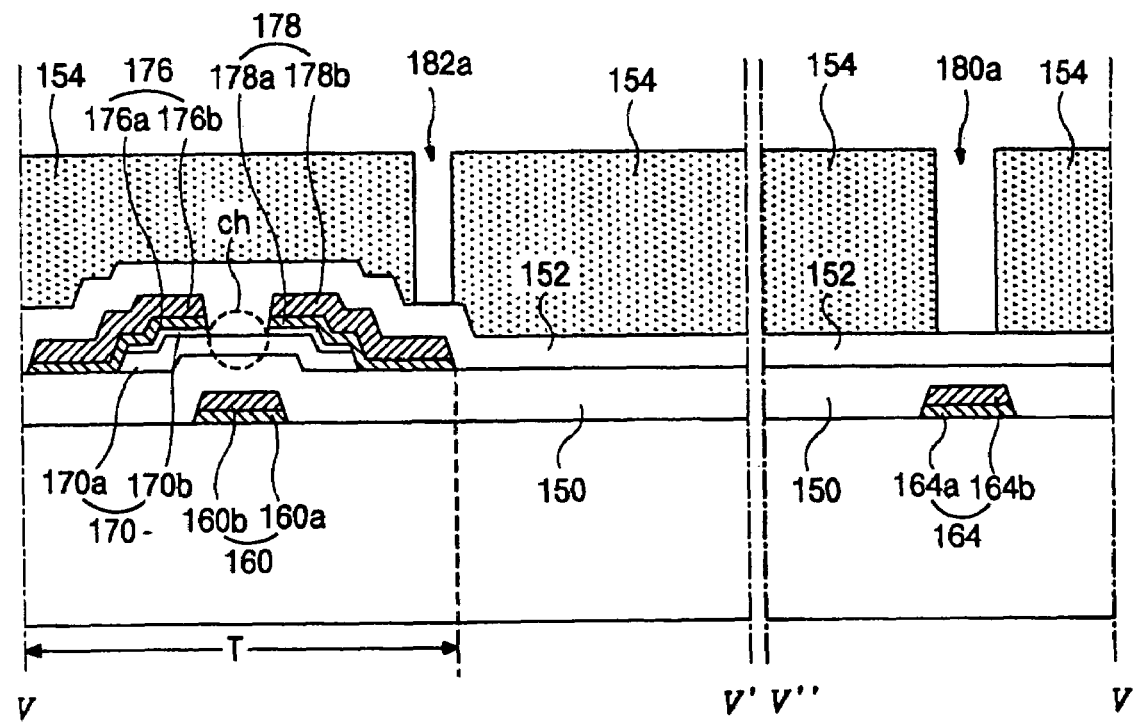

In FIG. 5B, first and second open holes 180a and 182a are formed in the second passivation layer 154. The first and second open holes 180a and 182a correspond to the gate pad 164 and the drain electrode 178, respectively. If the second passivation layer 154 is made of a photosensitive organic insulating material such as photo acryl, the first and second open holes 180a and 182a can be formed through an exposure, a development and a hardening of the second passivation layer 154.

Figure 5C:
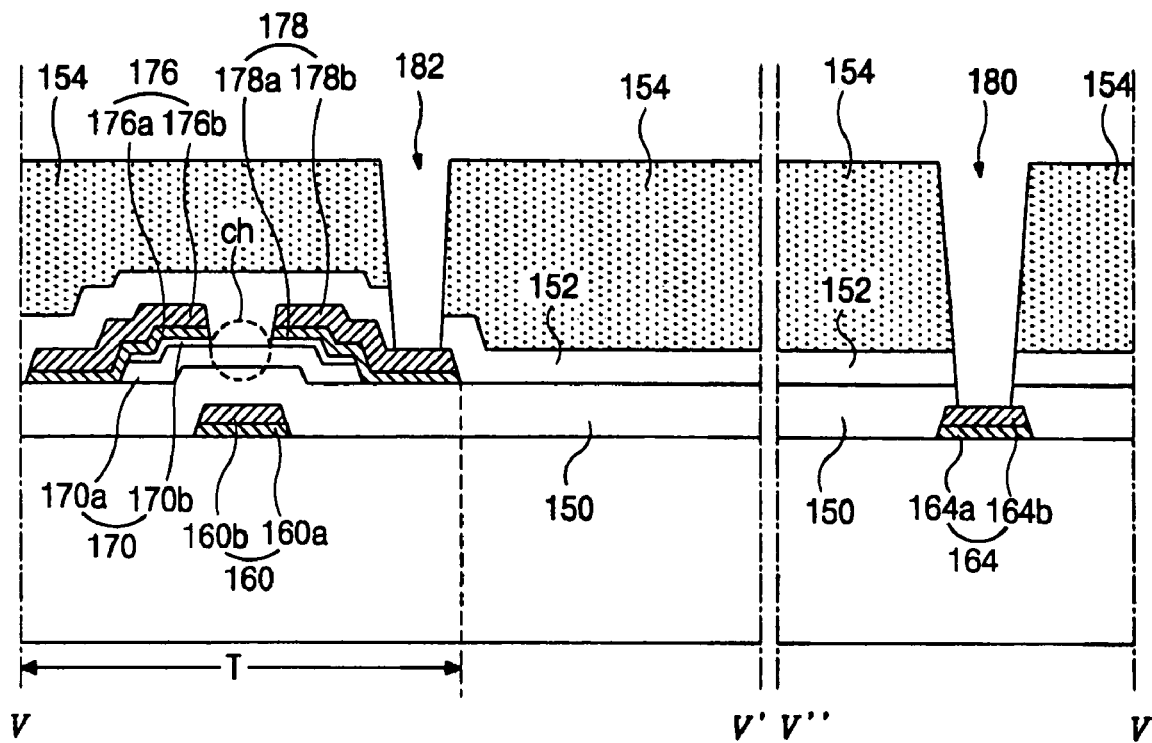

In FIG. 5C, a gate pad contact hole 180 and a drain contact hole 182 corresponding to the first and second open holes 180a and 182a (of FIG. 5B) are formed. The gate pad contact hole 180 and the drain contact hole 182 expose the gate pad 164 and the drain electrode 178, respectively. In detail, the gate pad contact hole 180 is formed through etching, preferably, dry-etching the first passivation layer 152 and the gate insulating layer 150 corresponding to the first open hole 180a (of FIG. 5B). Moreover, the drain contact hole 182 is formed through etching, preferably, dry-etching the first passivation layer 152 corresponding to the second open hole 182a (of FIG. 5B). Here, copper layers 164b and 178b of the gate pad 164 and the drain electrode 178 are exposed through the gate pad contact hole 180 and the drain contact hole 182, respectively. However, if the second passivation layer 154 includes an organic insulating material that is not photosensitive, the gate pad contact hole 180 and the drain contact hole 182 can be formed through a single etching process, preferably, a single dry-etching process without an additional process for open holes.

Figure 5D:
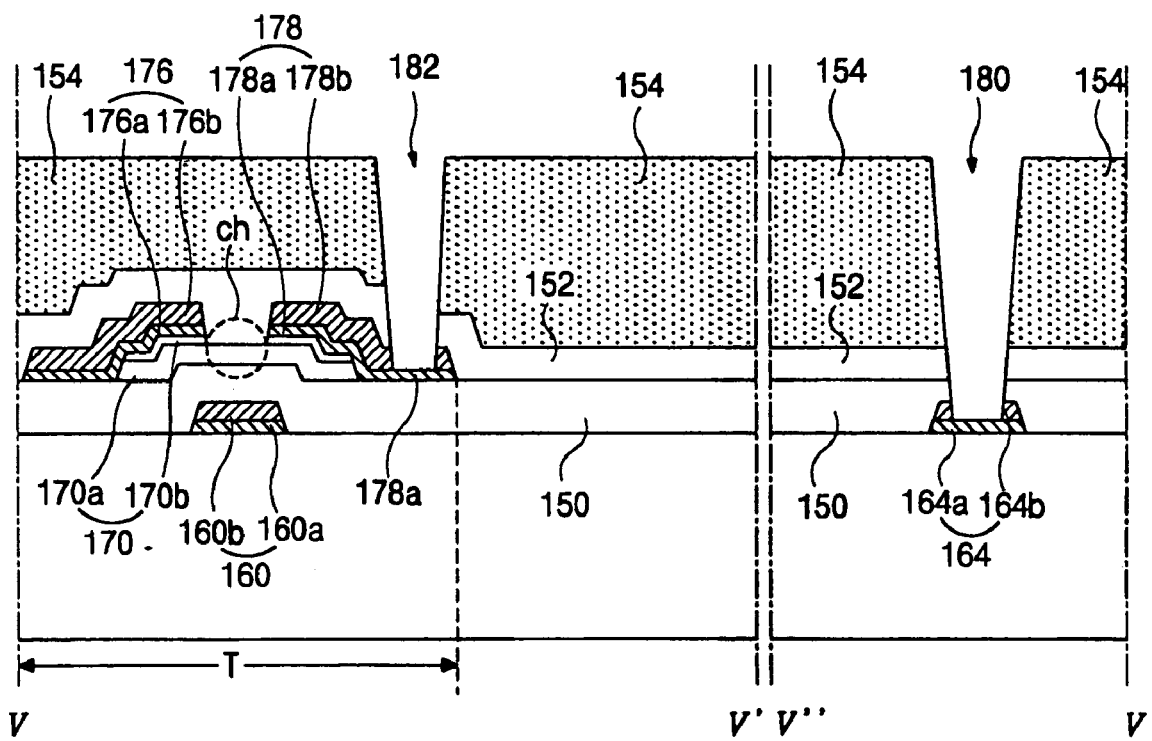

In FIG. 5D, the copper layers 164b and 178b of the gate pad 164 and the drain electrode 178 exposed through the gate pad contact hole 180 and the drain contact hole 182 are etched, and the barrier layers 164a and 178a of the gate pad 164 and the drain electrode 178 are exposed. Preferably, the copper layers 164b and 178b are eliminated by a wet-etching method. A compound of hydrogen peroxide ($H_2O_2$) and acetic acid ($CH_3COOH$) may be used as an etchant for wet-etching the copper layers 164b and 178b. Here, an organic residue (not shown) on the copper layers 164b and 178b, which results from a forming process of the gate pad contact hole 180 and the drain contact hole 182, are also eliminated during etching the copper layers 164b and 178b. Since the copper layers 164b and 178b having the organic residue thereon is etched, the organic residue also can be eliminated through the wet-etching process of the copper layers 164b and 178b. Accordingly, a gate pad terminal 190 (of FIG. 5E) and a pixel electrode 188 (of FIG. 5E) are substantially connected to the barrier layers 164a and 178a in the following process, and a problem of a poor electric contact due to an organic residue can be solved.

Figure 5E:
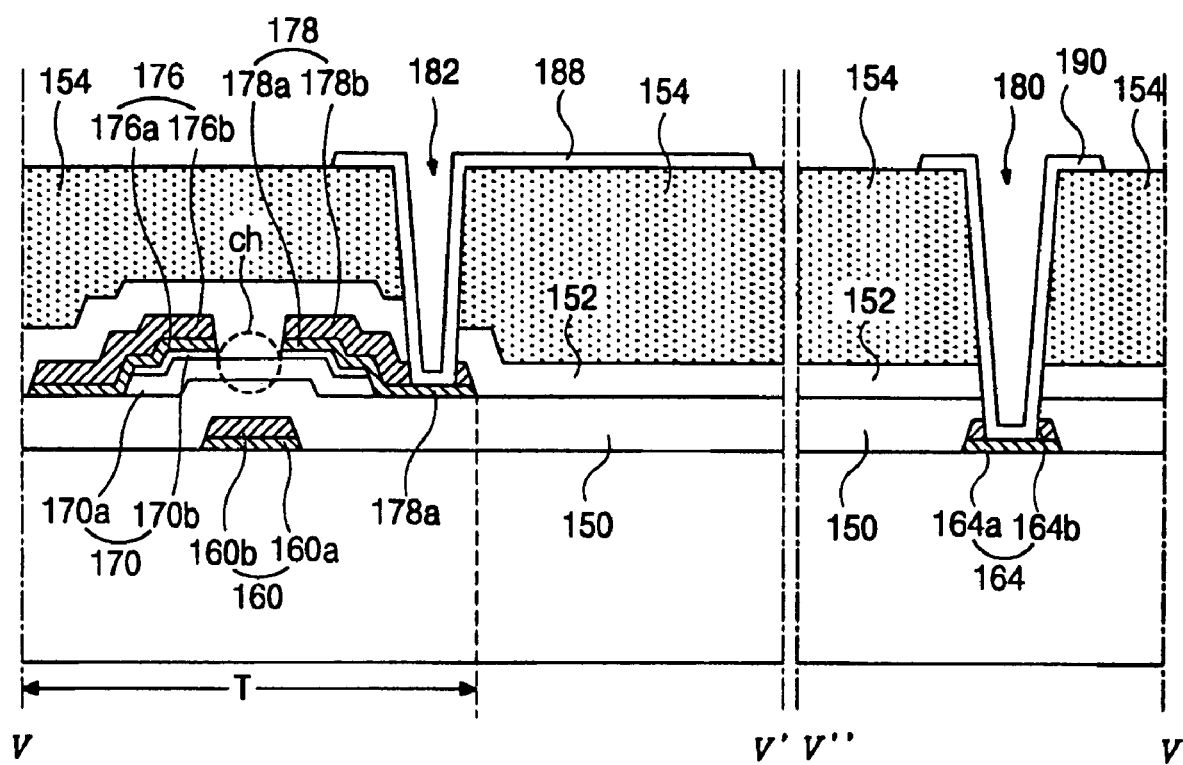

In FIG. 5E, a gate pad terminal 190 and a pixel electrode 188 are formed on the second passivation layer 154. The gate pad terminal 190 is connected to the copper layer 164*a* of the gate pad 164 through the gate pad contact hole 180, and the pixel electrode 188 is connected to the copper layer 178*a* of the drain electrode 178 through the drain contact hole 182. Moreover, the gate pad terminal 190 and the pixel electrode 188 are connected to a sidewall of the copper layers 164*b* and 178*b*. Here, the gate pad terminal 190 and the pixel electrode 188 include a transparent conductive material such as indium-tin-oxide (ITO) and indium-zinc-oxide (IZO).

Consequently, since an organic insulating material for high aperture ratio and a copper line for low resistance are effectively used in the present invention without a problem of a poor electric contact, a liquid crystal display device of high aperture ratio, large area and high display quality can be provided.

It will be apparent to those skilled in the art that various modifications and variations can be made in the method of manufacturing a flat panel display device of the present invention without departing from the spirit or scope of the invention. Thus, it is intended that the present invention cover the modifications and variations of this invention provided they come within the scope of the appended claims and their equivalents.

The invention claimed is:

1. An array substrate for a liquid crystal display device, comprising:
    a substrate;
    a gate electrode on the substrate;
    a gate insulating layer on the gate electrode;
    a semiconductor layer on the gate insulating layer;
    source and drain electrodes on the semiconductor layer, the source and drain electrodes including a copper layer as an upper layer and a barrier layer as a lower layer;
    a first passivation layer on the source and drain electrodes;
    a second passivation layer on the first passivation layer, the second passivation layer having a drain contact hole through the first passivation layer, the drain contact hole exposing the barrier layer; and
    a pixel electrode connected to the barrier layer through the drain contact hole.

2. The substrate according to claim 1, wherein the gate electrode has the same material as the source and drain electrodes.

3. The substrate according to claim 2, further comprising a gate line connected to the gate electrode, a data line crossing the gate line, a gate pad at on end of the gate line and a data pad at one end of the data line.

4. The substrate according to claim 3, wherein the first and second passivation layers have a gate pad contact hole and a data pad contact hole corresponding to the gate pad and the data pad, the gate pad contact hole and the data pad contact hole exposing the respective barrier layer of the gate pad and data pad.

5. The substrate according to claim 4, wherein the gate insulating layer is interposed between the gate pad and the first passivation layer.

6. The substrate according to claim 5, wherein the first and second passivation layer has the gate pad contact hole through the gate insulating layer.

7. The substrate according to claim 1, wherein the barrier layer includes one of titanium (Ti), molybdenum (Mo), chromium (Cr) and indium (In).

8. The substrate according to claim 1, wherein the first insulating layer includes an inorganic insulating material.

9. The substrate according to claim 8, wherein the inorganic insulating material includes one of silicon nitride (SiNx) and silicon oxide ($SiO_2$).

10. The substrate according to claim 1, wherein the second passivation layer includes an organic insulating material.

11. The substrate according to claim 10, wherein the organic insulating material has a dielectric constant less than about 3.

12. The substrate according to claim 10, wherein the organic insulating material is photosensitive.

* * * * *